United States Patent [19]

Buelow et al.

[11] 4,147,937
[45] Apr. 3, 1979

[54] ELECTRON BEAM EXPOSURE SYSTEM METHOD AND APPARATUS

[75] Inventors: Fred K. Buelow, Los Altos Hills; John J. Zasio, Sunnyvale; Laurence H. Cooke, Cupertino, all of Calif.

[73] Assignee: Fujitsu Limited, Kawasaki, Japan

[21] Appl. No.: 847,485

[22] Filed: Nov. 1, 1977

[51] Int. Cl.² ............................................. A61K 27/02
[52] U.S. Cl. ................................................. 250/492 A
[58] Field of Search ..................................... 250/492 A

[56] References Cited

U.S. PATENT DOCUMENTS 3,866,013  2/1975  Ryan ................................. 250/492 A

OTHER PUBLICATIONS

"Computer-Controlled Scanning—Pattern Fabrication" by Ozdemir et al, IEEE Trans on Electron Devices vol. ED-19 No. 5 May 1972 pp. 624-628.

Primary Examiner—Harold A. Dixon
Attorney, Agent, or Firm—David E. Lovejoy

[57] ABSTRACT

An electron beam exposure system and method for use in the process of fabricating microminiature devices at high speeds. The high-speed operation is achieved with a computer providing programmed commands specifying a particular pattern to be scanned. A processor, responsive to programmed data, generates scan data a line at a time and loads a line generator. The line generator steps to each exposure location in a line to provide control signals for controlling the position of the electron beam. The starting and end positions of scan lines in both the X and Y directions may be arbitrarily selected thereby eliminating the need for scanning areas not intended to be processed.

24 Claims, 10 Drawing Figures

TYPE +1

TYPE −1

TYPE +2

TYPE −2

TYPE +3

TYPE −3

FIG.—8

TYPE +4

TYPE −4

ELECTRON BEAM EXPOSURE SYSTEM METHOD AND APPARATUS

CROSS REFERENCE TO RELATED APPLICATIONS

OVERLAPPING BOUNDARY ELECTRON BEAM EXPOSURE SYSTEM METHOD AND APPARATUS, Ser. No. 847,476, filed Nov. 1, 1977, invented by Fred K. Buelow, John J. Zasio, and Lawrence H. Cooke and assigned to the assignee of the present invention.

BACKGROUND OF THE INVENTION

This invention relates to the fabrication of microminiature devices and, more particularly, to an automated, high-speed electron beam apparatus and method for making such devices.

It has long been known that the high-resolution and excellent depth-of-focus capabilities of an electron beam make it a practical tool for inclusion in an automated system for making microminiature electronic devices. The electron beam is controlled in a highly accurate and high-speed manner to expose an electron-resist-coated material as a step in the fabrication of extremely small and precise low-cost integrated circuits.

Although an electron beam can be deflected and blanked in a high-speed manner the area over which the beam is capable of being deflected is relatively small. A basic problem presented, therefore, is how to accommodate this small-area scan field to the rapid and efficient exposure of relatively large resist-coated areas such as desirable with increasingly larger semiconductor wafers. In addition to larger areas to be exposed, larger densities of circuit elements are desired on semiconductor. The trend in the industry has been a greater number of circuits per unit of area and a tendency towards smaller and smaller circuits. In this manner, it becomes increasingly possible to integrate an entire system or subsystem on a relatively few number of semiconductor chips.

In order to accommodate the greater density of circuits, the electron beam system is required to process a much greater amount of data. Without increased exposure rates and without improved techniques, the time required to process the data and make exposures becomes excessive. A basic problem, therefore, is presented as to how to increase the data rate of electron beam systems.

In accordance with the above background of the invention, it is an object of the present invention to provide an improved electron beam apparatus and method which is capable of greater data rates and hence is capable of a more rapid and more efficient exposure of high-density, resistcoated areas used in the manufacture of integrated circuit devices.

SUMMARY OF THE INVENTION

The present invention is an improved electron beam apparatus and method capable of high data rates which enable exposures to be made more rapidly and more efficiently.

The present invention includes a first data processing apparatus which provides stored words which specify the pattern to be generated by the electron beam. The apparatus includes a line processor responsive to the data from the first data processing apparatus to control the line-scan data at a high data rate. The second processor drives a line generator which steps to each spot of a line to control scanning by the electron beam apparatus.

The deflection of the electron beam is controllable both in an X coorrdinate and in a Y coordinate over a scan field. The line generator digitally controls the scanning either in the X or the Y direction. The output from the line generator is converted to provide an analog signal for driving the deflection circuitry of the electron beam column.

In one preferred embodiment, the line generator of the present invention includes a length counter which determines the length of a particular scan which is to be carried out in either the X or the Y direction. The line generator additionally includes a position counter which controls the present position of the electron beam in the direction of scanning. The position counter is loaded with the initial count and is stepped each time the length counter is decremented. A zero detector is provided for determining when the length counter is zero, thereby indicating that the end of a scan has been reached. The position counter is controlled to count up or to count down so that scans along the X or the Y directions can be in either a positive or negative direction. When the zero detector signals the line processor that it is empty, the line processor provides a new length count and new initial X and Y positions. Each new count and new position may be selected randomly relative to the old ones so that great flexibility is present and areas not intended to be processed do not need to be scanned.

In addition to moving the electron beam over a scan field, a motor-driven table is provided to drive the work piece in an X direction and a Y direction to locate a new area under the scan field. Position sensors are provided for sensing the actual position of the motor-driven table and for providing a digital correction to the electron beam deflection control whereby the position of the table and the electron beam are coordinated. In one preferred embodiment, the X and Y deflection signals are generated with digital-to-analog converters and the X and Y table correction signals are generated by digital-to-analog converters. The analog deflection signals and the analog correction signals are then summed to provide the signals for driving the deflection of the unit of the electron beam column.

In accordance with the above summary, the present invention achieves the objective of providing an improved electron beam apparatus and method for scanning an electron beam which is capable of high and efficient data rates.

Additional objects and features of the invention will appear from the following description in which the preferred embodiments of the invention have been set forth in detail in conjunction with the drawings.

DETAILED DESCRIPTION

Figure 1:
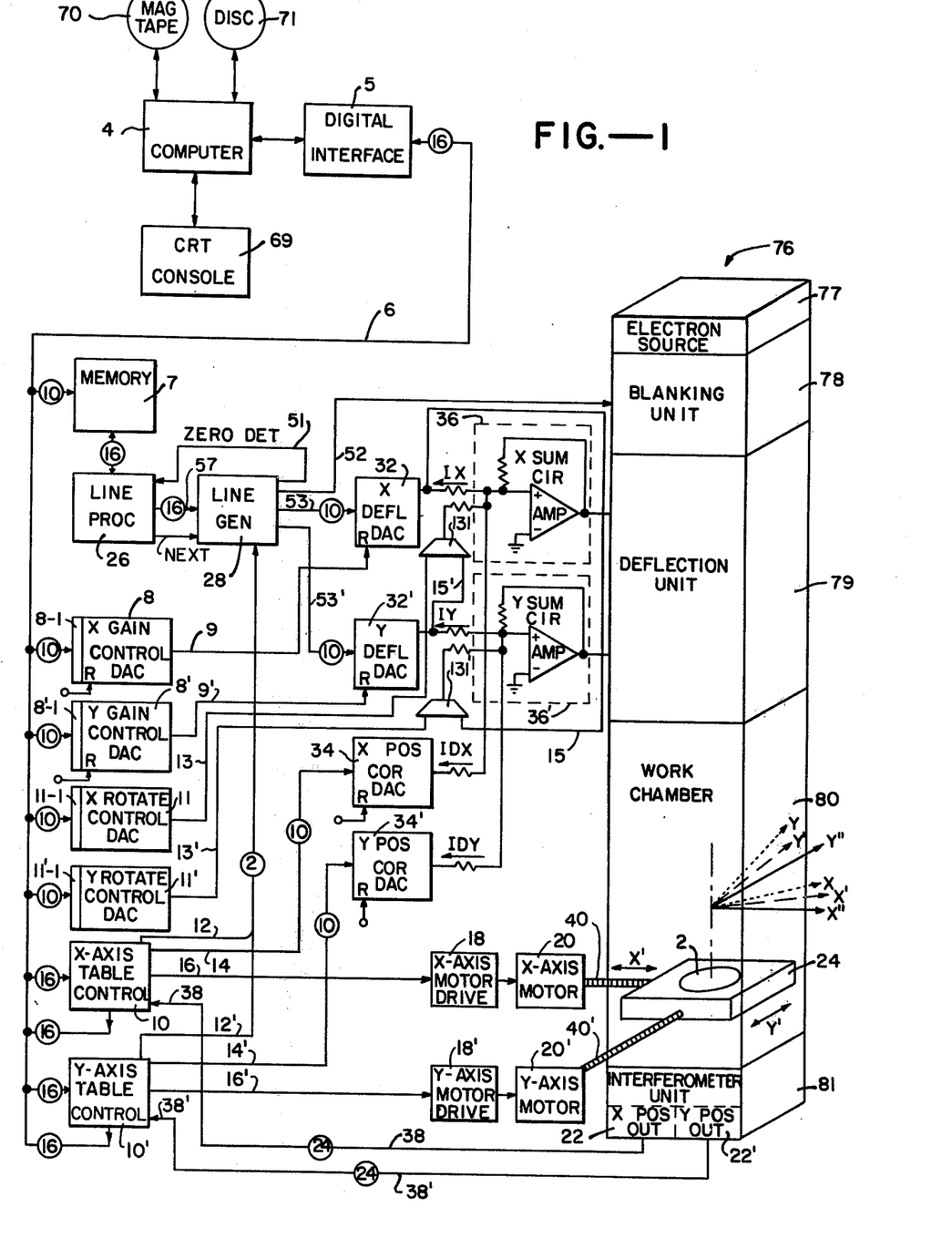
FIG. 1 depicts an overall electrical schematic block diagram of an electron beam apparatus in accordance with the present invention.

Overview-FIG. 1

In FIG. 1, a wafer or other work piece 2 to be exposed by an electron beam is positioned on the motor-driven table 24. The table 24 is located within the work chamber 80 of an electron beam column 76. The column 76 is a conventional device including an electron source 77, a blanking unit 78, a deflection unit 79, a work chamber 80, and an interferometer unit 81. The column 76 is typically like that manufactured by ETEC Corporation of Hayward, California.

The electron source 77 provides the electrons which are incident upon the work piece 2 on the table 24. Blanking unit 78 permits the electron beam to be focused on the work piece or blanks the electron beam to inhibit electrons in a conventional manner. The blanking unit 78 is selectively controlled to inhibit or pass the electron beam by the beam blanking control line 52 from the line generator 28.

The deflection unit 79 includes both X and Y deflection coils (not shown) for positioning the electron beam in the X and Y axes. The X coil is driven by the output from the X sum circuit 36. Similarly the Y coil is driven by the Y sum circuit 36'.

The sum circuits 36 and 36' provide the X and Y drive signals to the deflection unit by summing a number of input signals. First, the sum circuits 36 and 36' receive the IX and IY commanded position signals as inputs from converters 32 and 32', respectively, which in turn are commanded by the line generator 28 and processor 26. The IX and IY signals specify the location of the electron beam with respect to a unit size in some predetermined coordinate system. In one embodiment, the unit size is $0.5 \times 10^{-6}$ meter.

The sum circuits 36 and 36' also receive correction signals IDX and IDY, respectively, which correct the position of the electron beam with some correction unit size as a function of the measured position of the movable work piece 2 as measured by an interferometer unit 81. In one embodiment, the size of the correction signal is in units of $0.08 \times 10^{-6}$ meter. Accordingly, one unit of the IX position command signal ($0.5 \times 10^{-6}$ meter) summed with one unit of the IDX correction signal ($0.08 \times 10^{-6}$ meter) specifies a deflected distance of $0.58 \times 10^{-6}$ meter. Similarly, ten units of IX ($5.0 \times 10^{-6}$ meter) and 20 units of IDX ($1.6 \times 10^{-6}$ meter) specifies a deflected distance of $6.6 \times 10^{-6}$ meter.

The sum circuits 36 and 36' also receive rotation signals IRX and IRY, respectively, from units 131 and 131' for rotating the XY electron beam axes relative to the X'Y' axes of table 24. In FIG. 1, the work table 24 is driven in the X-axis direction by the X axis motor 20 and in the Y-axis direction by the Y axis motor 20' to precisely position the work piece 2 relative to the incident electron beam. The actual position of the work piece 2 and the table 24 is measured by the interferometer unit 81. Typically the interferometer unit 81 includes an interferometer for measuring the X axis position which provides an X position output 22. Similarly, the interferometer unit 81 includes a Y axis unit providing a Y position output 22'. One typical interferometer unit is manufactured by Hewlett Packard Corporation and is model number HP5501. Such a unit provides a 24-bit output which is capable of measuring the actual position of the work piece 2 and table 24 to approximately $0.08 \times 10^{-6}$ meter. The interferometer unit is capable of tracking movements at rates of approximately up to 15 centimeters per second. The X and Y position outputs 22 and 22' from the interferometer unit 81 are connected as inputs to the X and Y axis table controls 10 and 10' respectively. Controls 10 and 10' provide signals to the units 34 and 34' to generate the correction signals IDX and IDY, respectively. In FIG. 1, the control circuitry for controlling the electron beam column 76 includes a computer 4 which commands the operation of the system in the exposure of the work piece 2 by the electron beam. Computer 4 in one typical embodiment is a Hewlett Packard model HP21MX. Computer 4 connects over a conventional digital interface 5 to the data bus 6. The computer 4 is also connected in a conventional way to I/O devices such as a CRT console 69, a magnetic tape unit 70 and a magnetic disc unit 71. The computer 4 controls the remainder of the system.

The computer 4, through the digital interface 5, communicates with a number of addressable units connected to bus 6. Bus 6 is typically a 16-bit bus with appropriate conventional selection means (not shown) for selecting an addressed one of the units connected to bus 6.

In FIG. 1, the units connected to bus 6 include the memory 7, the X gain control 8, the Y gain control 8', the X rotation control 11, the Y rotation control 11', the X table control 10 and the Y table control 10'.

Memory 7 is a random access memory typically storing 2,048 or more 16-bit words. The X and Y gain controls 8 and 8' are typically digital-to-analog converters (DAC). When selected by the digital interface 5, the controls 8 and 8' convert the digital outputs to analog levels on lines 9 and 9', respectively. Lines 9 and 9' each connect as a reference (R) input to the X and Y deflection DAC's 32 and 32'. The DAC's 8 and 8' and the DAC's 11 and 11' are conventional devices of the type which typically receive a 10-bit input to responsively provide one of 1024 levels for the analog signal output. Such devices are conventional and in one typical embodiment are manufactured by Burr Brown with model number 60-10. Since those DAC devices do not have means for storing the digital signals from bus 6, each of the DAC's 8, 8', 11 and 11' are shown in FIG. 1 to include conventional registers 8-1, 8'-1, 11-1, and 11'-1 for storing the digital data, respectively, under command of the interface 5.

When exposing the work piece 2 to form a pattern thereon, it is important that the deflection gain of the electron beam be accurately controlled so that the actual size of the electron beam scan field on the work piece 2 corresponds to the desired size of the electron beam scan field. The gain controls 8 and 8' are utilized for controlling the size of the electron beam scan field. When the beam deflection exceeds or is less than required for the desired scan field size, the deflection gain signals from controls 8 and 8' are controlled to appropriately adjust the respective referenced inputs to the converters 32 and 32'.

The X and Y rotation controls 11 and 11' are digital-to-analog converters (DAC) of the same type as the converters for controls 8 and 8'. The controls 11 and 11' convert digital outputs from the computer 4 into an analog level on lines 13 and 13', respectively. Lines 13 and 13' are each connected to one of the inputs of the multiplying amplifiers 131 and 131', respectively. The other input to amplifier 131 is supplied from the output of the Y converter 32'. Similarly, the other input to the amplifier 131' is supplied from the output of the X converter 32. The amplifiers 131 and 131', respectively, provide output signals which are connected in common with and summed with the outputs of the X and Y deflection converters 32 and 32', respectively, in the sum circuits, 36 and 36', respectively.

In FIG. 1, it is desired that the scanning axes, X and Y, of the electron beam coincide with the axes X' and Y' of the table 24, and with the axes, X" and Y", of the work piece 2. The three sets of axes XY, X'Y' and X"Y" are shown with a common origin in FIG. 1. In order to bring the axes into common alignment, rotation of the electron beam axes XY is useful. The rotation controls 11 and 11' are utilized for adjustably rotating the axes XY of the electron beam relative to the axes X'Y' of the table and the axes X"Y" the work piece 2. In operation, digital signals specifying the degree of rotation are supplied from the computer 4 to the inputs of the rotation controls 11 and 11'. The outputs from control 11 and 11' in turn control the rotation by controlling the electron beam deflection through operation of the sum circuits 36 and 36' and the amplifiers 131 and 131'.

The rotation controls 11 and 11' are also utilized for controlling the perpendicularity of the electron beam scanning in response to the digital outputs from the computer 4. Perpendicularity of the electron beam scanning refers to the X axis movement relative to the Y axis movement.

In FIG. 1, the X and Y table controls 10 and 10' receive data from and connect data to the 16-bit bus 6. Controls 10 and 10' are shown in further detail in FIG. 2. Briefly, the control 10 receives a commanded position from the bus 6. The commanded position from bus 6 is converted to the drive signal on line 16 for driving the X motor drive 18. The X motor drive 18 in turn drives the X motor 20 to position the X axis of the table 24 within the chamber 80. Similarly, the Y table control 10' via line 16' energizes the Y motor drive 18' which in turn energizes the Y motor 20'. The Y motor 20' drives the table 24 to the desired Y axis position. The motor drive 18 and 18' and the motors 20 and 20' are conventional devices for indexing a motor-driven table. A typical motor drive and motor employed in one preferred embodiment of the invention is manufactured by Torque Systems Inc. having model number RL 3260E. Such a system has a capacity of driving the table 24 at a rate of approximately 5 centimeters per second, and accelerating or decelerating at a rate of 10 meters/sec$^2$ (approximately 1G).

In addition to commanding the actual position of the table 24, the table control 10 and 10' also compare the commanded position (received over bus 6) with the actual position measured by the interferometer unit 81. The difference between the commanded position and the actual position is utilized to generate a correction signal on the 10-bit buses 14 and 14' for the controls 10 and 10', respectively. The 10-bit correction buses 14 and 14' are connected as inputs to the X and Y position correction DAC's 34 and 34'. The table 24 can be positioned by the motor drives 18 and 18' within an accuracy of about 0.24 micron from the commanded position. In order to provide higher accuracy as is necessary for scanning small areas, the converters 34 and 34' are utilized. The converters 34 and 34' form the analog correction signals IDX and IDY. The correction signals IDX and IDY are summed with the line scan signals IX and IY, respectively, in the sum circuits 36 and 36'. The line scan signals IX and IY are generated by the X and the Y deflection digital-to-analog converters (DAC) 32 and 32', respectively.

The converters 32 and 32' are of the same type as the converter 8 and 8'. Converters 32 and 32' are driven by inputs from the line generator 28 which is in turn driven by the line processor 26.

The line processor 26 is typically a conventional microprocessor such as the Motorola 6800. The line processor 26 accesses data for a line scan from the memory 7. Processor 26 then loads the line generator 28 with data sufficient for one line scan. The line generator 28 then is clocked at a high data rate loading the appropriate values into the converters 32 and 32' to perform a line scan at a high data rate. Converters 32 and 32' generate the line drive signals IX and IY in response to the outputs from line generator 28 as adjusted by the reference levels output from the gain controls 8 and 8'. Any correction factors required for drive signals IX and IY are derived from the converters 34 and 34' and the controls 11 and 11' which are all summed in the sum circuits 36 and 36'. The sum circuits 36 and 36' in turn drive the deflection unit 79 to actually position the electron beam.

The line generator 28 receives data from the line processor 26 via the 16-bit bus 57. Generator 28 in turn generates 10-bit deflection commands on output buses 53 and 53' which are connected to the X converter 32 and to the Y converter 32', respectively. Generator 28 also provides an output signal on line 52 which controls the blanking unit 78.

Line generator 28 provides a zero detect output line 51 which connects to the line processor 26. Zero detect line 51 signals the line processor 26 to indicate when the line generator 28 has completed a line scan. When generator 28 has completed a line scan, processor 26 immediately loads the generator 28 with a new line command and scanning continues in this manner.

The line generator 28 functions to inhibit line scanning whenever a STOP SCAN signal is drived on the lines 12 or 12' from the X and Y table controls 10 and 10'. The STOP SCAN signals signify that the commanded position of the table 24 relative to the actual position of table 24 exceeds a predetermined error (for example, greater than correctable by the 10-bit correction signal). Whenever this predetermined error is exceeded, the STOP SCAN signal functions to inhibit further operation of the line generator until the error is reduced to within the acceptable limits.

Operation of FIG. 1 Apparatus

In FIG. 1, the computer 4 stores data in its memory in a standard format. One format for the data storage in connection with one particular pattern to be scanned is shown in TABLE II of the above cross-referenced application. A portion of that TABLE II is reproduced in the TABLE below and is used to explain the data format for data transferred from computer 4.

TABLE

| RECORD NO. | WORD 1 X | WORD 2 Y | WORD 3 XL | WORD 4 YL |
|---|---|---|---|---|
| 1 | 1 | 5 | 685 | 1 |
| 2 | 3 | 733 | 0 | 70 |
| 3 | 1606 | 1350 | 0 | 10 |
| 4 | −1204 | −900 | 0 | 0 |
| 5 | 803 | 900 | 0 | 8 |
| 6 | 196 | 692 | 240 | 240 |
| 7 | 436 | 772 | 20 | 80 |
| 8 | 196 | 292 | 240 | 240 |
| 9 | 436 | 372 | 20 | 80 |
| 10 | 596 | 92 | 240 | 240 |
| 11 | 676 | 332 | 80 | 20 |
| 12 | 713 | 577 | 200 | 10 |
| 13 | 711 | 309 | 10 | 276 |
| 14 | 803 | 0 | 0 | 0 |
| 15 | 803 | 900 | 0 | 9 |
| 16 | 193 | 92 | 240 | 240 |
| 17 | 273 | 332 | 80 | 20 |
| 18 | 593 | 92 | 240 | 240 |
| 19 | 673 | 332 | 80 | 20 |
| 20 | 710 | 517 | 203 | 10 |
| 21 | 708 | 309 | 10 | 216 |
| 22 | 310 | 547 | 603 | 10 |
| 23 | 308 | 309 | 10 | 246 |
| 24 | 110 | 577 | 803 | 10 |

In the format of the system described, after RECORD NO. 1, four types of RECORD NO.'s are employed. The four types are identified by the 0 and non-zero (indicated by N) states of WORD 3 and WORD 4 as follows: 00 specifies a table move by the X and Y amounts of WORD 1 and WORD 2; ON specifies header information; NO specifies a special shape to be described hereinafter; and NN specifies a rectangular shape having the X, Y, XL, YL values of WORD 1, WORD 2, WORD 3, and WORD 4.

In the TABLE, the RECORD NOs. 1 and 2 indicate certain information about the overall pattern to be scanned. WORD 2 of header RECORD NO. 2 indicates that the TABLE will include 733 additional entries.

In header RECORD NO. 3, WORD 1 and WORD 2 indicate that the overall size of the pattern to be scanned is 1606 by 1350 microns in size in the X and Y axis, respectively. In WORD 4 of RECORD NO. 3, the 10 indicates that the pattern to be scanned is broken into 10 different partitions. For each one of the partitions, the table will be moved relative to the electron beam scan field. At each table position, the RECORD NOs. for portions of the overall pattern are exposed by scanning the electron beam for that partition.

RECORD NO. 4 is the first record in the first one of the 10 partitions identified in WORD 4 of RECORD NO. 3. In RECORD NO. 4, WORD 1 and WORD 2 indicated in one-half micron units the X axis and Y axis movements, respectively, of table 24 which are required to relatively position the scan field and the work piece in order for the first partition to be scanned.

When RECORD NO. 4 is accessed in computer 4, a word indicating a −1204 one-half micron move is transmitted to and latched in the X axis table control 10 (in an X commanded position register 42 of FIG. 2) and a word indicating a −900 one-half micron move indication is transmitted and latched in the Y axis table control 10' (in a Y commanded position register like register 42). In the manner hereinafter described, the table controls 10 and 10' cause the table 24 to be moved (from location 130 in FIG. 7) relative to the scan field of the electron beam.

After the WORD 1 and WORD 2 information is stored in the controls 10 and 10', the computer 4 is next signaled by header RECORD NO. 5 that the scan field measures 803 by 900 one-half microns in the X and Y dimensions, respectively. WORD 4 of RECORD NO. 5 indicates that the pattern to be scanned includes eight shapes, which in the embodiment of the TABLE are rectangular shapes. The eight rectangular shapes of the partition are included in the next eight record numbers 6 through 13 of the TABLE. RECORD NO. 5 signals the computer 4 to transfer the four words associated with each of the RECORD NOs. 6 through 13 to the memory 7.

In one embodiment, the memory 7 functions as a conventional first in, first out (FIFO) memory. In one example, memory 7 is a model MMI 67401 memory manufactured by Monolithic Memories, Inc. The first record in, RECORD NO. 6, is the first record out to the line processor 26. Any conventional technique of storing data in this manner may be employed. For example, if wrap-around addressing is employed for the memory 7, each new four word record stored in memory 7 from computer 4 is placed in the next address after the last entry. Computer 4 starts loading RECORD NO. 6 at address 0, RECORD NO. 7 at address 1, and so on. In a similar manner, processor 26 begins accessing information from memory 7 starting with the 0 address and increments one to the next address for each new record number to be accessed.

With this FIFO embodiment, the memory 7 stores four words, WORD 1, WORD 2, WORD 3 and WORD 4 at each memory 7 address. Each of the four words at one address is then available to be accessed by the line processor 26.

The line processor 26 of FIG. 1 is programmed to access the words from the record numbers stored in the memory 7 and provide information to the line genrator 28. The steps performed by the processor 26 are as follows. Processor 26 maintains an address count which is typically reset to some predetermined address at the beginning of an operation.

Upon being thus reset, the processor 26 commences accessing records from the memory 7. When processing non-special records of the type in the TABLE, the shapes to be scanned are rectangular.

The line processor 26 has an internal A buffer and an internal B buffer for storing four words corresponding to the four words accessed from memory 7. The processor 26 may have its own internal storage for buffers A and B or may utilize specifically allocated locations in memory 7.

The first step of processor 26 after accessing the words of a record number is to examine WORD 4 to determine if it is a zero or non-zero value. In the TABLE, RECORD NO. 6 has a non-zero value of 240 in WORD 4.

With a non-zero value in WORD 4, the next step is to determined whether an X axis or a Y axis scan is to be carried out. This determination is made by comparing the XL and YL values of WORD 3 and WORD 4 to determine which is larger. If XL is greater than or equal to YL, then X axis scanning is to be carried out. If YL is greater than XL, then Y axis scanning is to be carried out. Since for RECORD NO. 6, XL and YL are equal, an X axis scan is to be carried out. To indicate an X axis scan, BIT 15 of WORD 3 and WORD 4 in the A buffer is set to a logical 1. Since RECORD NO. 6 is the first shape to be scanned, BIT 14 in WORD 3 and WORD 4 is also set to 1, indicating a positive scan. BIT 14 and BIT 15 are used to store these indications since they are otherwise unused because only the low-order 10 bits of the 16-bit words are otherwise employed. If a Y axis scan is to be carried out, then BIT 5 of WORD 3 and WORD 4 is set to a logical 0.

The A buffer is loaded with the four words of the record from memory 7 with BIT 14 and BIT 15 properly set. With the A buffer thus filled, the B buffer is then filled. The information in the A buffer is utilized to scan one line in the positive direction. The information to be placed in the B buffer will be utilized to scan the next line in the negative direction. Thus the line scanning is carried out by alternating from positive to negative scans by alternating between the A and B buffers in the line processor 26.

In the B buffer, for scanning in the X direction, the X value of WORD 1 in the B buffer is made equal to the sum of the X and XL values of the A buffer and, in the B buffer, the Y coordinate is made equal to the X value in the A buffer plus one. Also, the YL value is decremented by 1. If scanning were in the Y axis, the X coordinate would be incremented by plus one; the Y coordinate in the B buffer would be equal to the sum of the Y and YL values in the A buffer, and XL would be decremented by 1. For the RECORD NO. 6, the four words in the B buffer are 436, 693, 240, and 239.

At this point in time, both the A and B buffers have been initially loaded and a processing loop is entered by the line processor 26. The first step in the processing loop is to test the length field XL or YL which is opposite the axis of scanning. In the present example for RECORD NO. 6 where an X axis scan is being carried out, the YL field is tested for a non-zero value. In the present example, its value is 240. If a zero value is detected, then the line processor 26 exits from the processing loop.

Next, assuming a ZERO DET signal has been detected from the line generator 28, the X,Y and length (either XL or YL) contents of the A buffer are dumped to the line generator 28 in a manner hereinafter described in conenction with FIG. 3.

After the dump of the A buffer, the non-scanning axis values (Y and YL in the present example for RECORD NO. 6) in the A buffer are each changed by a quantity of 2. In the present example, the quantity YL is drecremented from a value of 240 to a value of 238 while the value of Y is incremented by 2 from 692 to 694.

Next, upon detection of a ZERO DET signal, the contents of the non-scanning length count (XL or YL) in the B buffer is interrogated to determine if it is equal to or less than zero. If it is equal to or less than zero, then the processing loop is exited. If it is not, then the X,Y and length (XL in the RECORD NO. 6 example) contents of the B buffer are dumped to the line generator 28. Thereafter, the non-scanning axis values are changed by 2. In the present example, the YL value is decremented by 2, from 39 to 37 while the Y coordinate is incremented by 2 from 693 to 695.

At this time, the line processor 26 returns to the beginning of the processing loop and repeats the loop all over again until a zero detection is obtained. In the present example, the processing loop will be completed 120 times for a total of 240 line scans.

Upon exiting the processing loop after the the 120 executions, the line processor 26 is signaled to obtain the next record, RECORD NO. 7, and commence the initial loading of the A and B buffers in the manner previously described. Since the YL field of 80 is greater than the XL field of 20, scanning for RECORD NO. 7 will be in the Y axis direction.

Therefore, the A buffer is filled with the four words for RECORD NO. 7 in the TABLE. Because a Y axis scan is to be carried out, BIT 15 of WORD 3 and WORD 4 in the A buffer is filled with a 0 while BIT 14 is a 1 to indicate a positive Y axis scan.

In a similar manner, the B buffer is filled with the four words 437, 852, 19, and 80 where the BIT 15 of WORD 3 and WORD 4 is 0 indicating a Y axis scan and the BIT 14 of WORD 3 and WORD 4 is 0 indicating a negative Y axis scan. With these initial values loaded into the A and B buffers, the processing loop is entered and processed until a 0 is detected for WORD 3 in either the A or the B buffer.

Only three of the four words from the A and B buffers are transferred during a dump from the line processor to the line generator 28. Those three words include the X and Y coordinates of WORD 1 and WORD 2. The other word to be transferred is either the XL or the YL value of WORD 3 or WORD 4. Since the axis of scan is determined by BIT 15, BIT 15 of both of the WORD 3 and WORD 4 in buffers A and B are loaded with a 0 or a 1. A 1 indicates an X axis scan and a 0 indicates a Y axis scan. Whenever a 1 is loaded into BIT 15, then it is the WORD 3 which is the third word transferred to the line generator and whenever a 0 is in BIT 15 then it is the WORD 4 which is transferred into the line genrator.

When all of the RECORD NOs. 6 through 13 have been processed, the work table 24 must again be moved to relatively position the scan field of the electron beam over the next partition. The RECORD NO. 14 in the TABLE indicates that a 803 one-half micron move in the positive X direction is required with no movement in the Y direction. RECORD NO. 15 indicates that the next partition is 803 by 900 one-half microns and is defined by nine shapes. The nine shapes appear in RECORD NOs. 16 through 24. Those record numbers are transferred to the memory 7 and processed in the same manner as for the first partition.

It has been found that data transfers from computer 4 to memory 7 can be non-synchronous and can have a slower word rate (e.g. $10^6$ words/sec for a burst mode) then the bit rate of data transfers from line generator 28 (e.g. $10^8$ bits/second).

Figure 2:
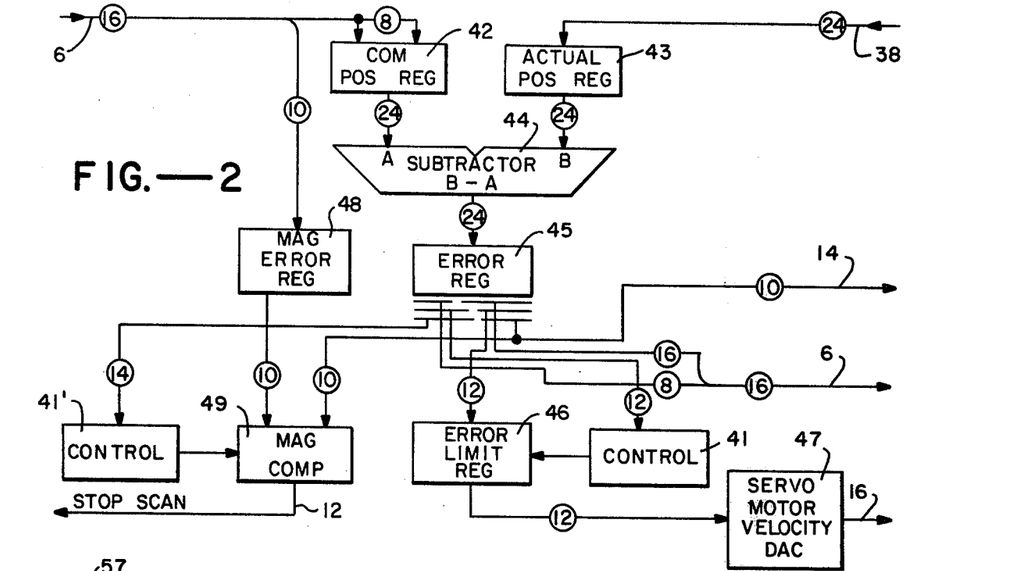
FIG. 2 depicts one of the two table controls which form part of the FIG. 1 apparatus.

Table-Control-FIG. 2

In FIG. 2, further details of the table controls 10 and 10' of FIG. 1 are shown. In FIG. 2, only the X table control 10 is actually shown since the Y table control 10' is identical.

In FIG. 2, the 16-bit bus 6 from the digital interface 5 is selectively gated to the commanded position register 42 and the maximum error register 48. The commanded position register 42 is a 24-bit register which receives the full 16-bits of bus 6 as one field and 8 bits of bus 6 as a second field. The lowest-order bit (and each count) in register 42 represents a distance of $0.08 \times 10^{-6}$ meter. The fields are separately addressed by the computer 4 of FIG. 1 and are separately selected at different times by the digital interface 5 in a conventional manner for computers. At still a different time, a 10-bit field of the 16-bit bus 6 is selected for the maximm error register 48. The lowest-order bit (and each count) in register 48 represents a distance of $0.08 \times 10^{-6}$ meter.

In FIG. 2, the actual position register 43 is a 24-bit register for receiving the actual position data from the 24-bit bus 38 from the interferometer unit 81 of FIG. 1. The lowest-order bit (and each count) in register 43 represents a distance of $0.08 \times 10^{-6}$ meter. The 24-bit outputs from the commanded position register 42 and the actual position register 43 are subtracted in a conventional 24-bit subtractor 44. The output from this subtractor is connected on a 24-bit bus to a 24-bit error register 45. The contents of the error register 45 are gated selectively to a number of locations in a number of field sizes. A low-order 16-bit and a high-order 8-bit field connect to the bus 6 for returning data through the digital interface 5 to the computer 4 of FIG. 1. The high-order 12 bits from error register 45 are input to the gate control 41. The low-order 12 bits from the register 45 are input to the error limit register 46. The low-order 10 bits connect to the magnitude comparator 49 and connects an output on bus 14 to a position correction DAC 34 in FIG. 1. The high-order 14 bits from register 45 connect to the control 41'.

Control 41, in one embodiment, is an EXCLUSIVE-OR gate network (not shown) for examining the 12 high-order bits from register 45. For positive errors less than $+4095$ ($2^{12}-1$), such network detects the all 0's condition of the 12 high-order bits. For positive errors greater than $+4095$, the network detects a 1 in any of the 12 high-order bit positions. In a similar manner, the network also detects for negative errors greater than or less than $-4096$ ($-2^{12}$).

If control 41 detects an error greater than $+4095$ ($2^{12}-1$) in register 45, it forces the error limit register 46 to the binary equivalent of $+4095$ producing the maximum negative velocity of the servo.

If control 41 detects an error less than $-4096$ ($-2^{12}$) in register 45, it forces the error limit register 46 to the binary equivalent $-4096$ producing the maximum positive velocity of the servo.

If the error is between the above two limits ($+4095$ and $-4096$), the error value in register 45 is fed directly to register 46 and then to converter 47 producing a servo motor velocity signal on line 16 proportional to the error value. This proportional velocity signal provides an overdamped drive response to the servo motor system while allowing it to accurately position the table 24 to an accuracy of less than one micron.

The contents of error register 45 and maximum error register 48 are fed to magnitude comparator 49. If the magnitude of the error exceeds the value in register 48, a STOP SCAN signal is provided to the line scan generator 28 of FIG. 1.

The 10 low order bits of register 45 also form the 10-bit bus 14 which forms the position correction signal for the position correction converter 44 of FIG. 1.

By way of summary, the table control of FIG. 2 includes a means for driving the table with a signal having a magnitude proportional to the difference between the commanded position and the actual position of the table, includes means for providing a position correction signal proportional to the difference between the commanded position and actual position of the table and provides a STOP SCAN signal whenever the difference between the commanded position and the actual position exceed a predetermined error.

Figure 3:
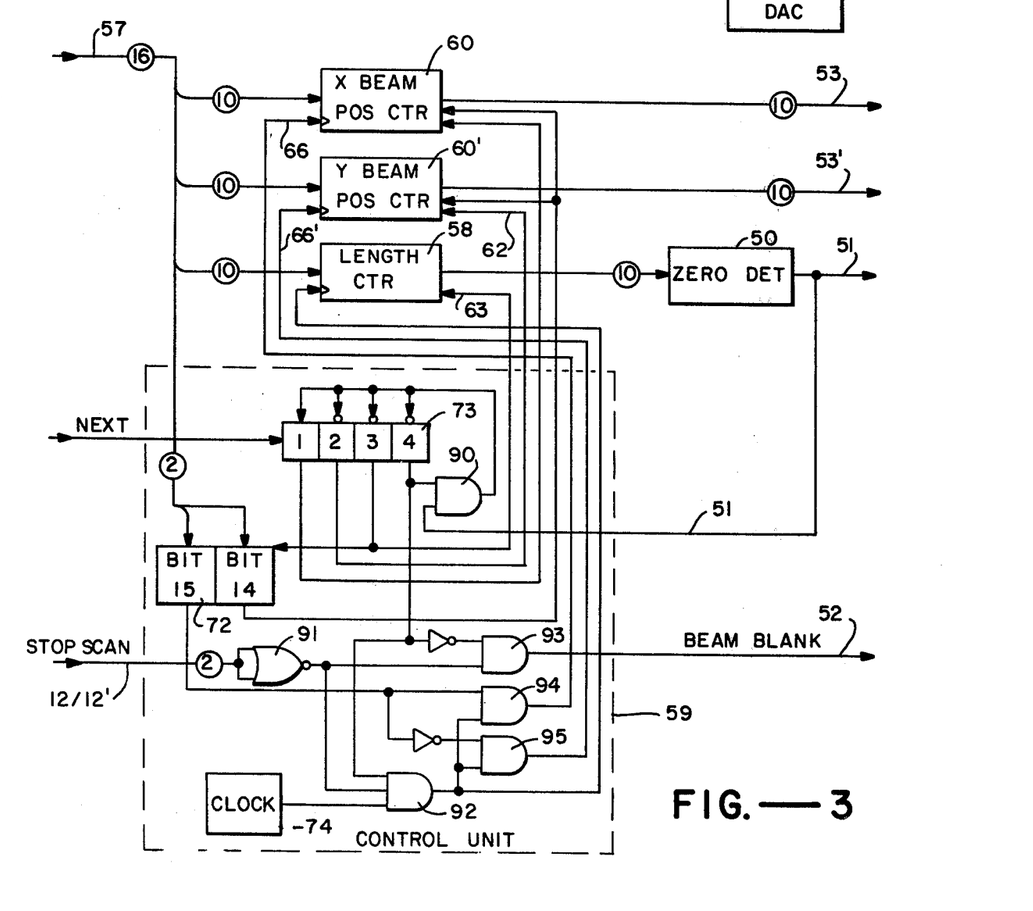
FIG. 3 depicts a line generator which is one component within the FIG. 1 apparatus.

Line Generator-FIG. 3

In FIG. 3, the line generator 28 of FIG. 1 is shown in greater detail. The line generator functions to provide signals to the deflection unit 79 for commanding the electron beam to scan a line at a time in discrete steps. The X location of the beam is stored in the X beam position up/down counter 60. The Y location of the beam is stored in the Y beam position up/down counter 60'. The number of steps to be scanned (in either the X or Y directions) is stored in counter 58. The lowest-order bit (and each count) in each of the counters 58, 60 and 60' represents a distance of $0.5 \times 10^{-6}$ meter. Scanning occurs for the number of steps represented by the count in length counter 58. Counter 58 and either the X counter 60 or Y counter 60' are stepped by a clock signal to cause the electron beam to be scanned. The 16-bit bus 57, from the processor 26 of FIG. 1, connects to the 10-bit length counter 58, to a 2-bit register 72 in the control unit 59, and to the 10-bit beam position counters 60 and 60'.

The line processor 26 supplies three 16-bit words to the line generator 28 when it receives a zero detection signal on line 51. Control unit 59 in FIG. 3 controls the distribution of the three words to parallel load the three low-order 10 bits of the first, second and third words from bus 57 into the X beam position counter 60, the Y beam position counter 60', and into the length counter 58, respectively, during first, second, and thrid stages of a load sequence controlled by sequenser 73. Upon receipt of the zero detection signal from detector 50, the sequencer 73 through gate 90 is reset to a 1 in the first stage and 0's in the remaining stages. During the first stage, sequencer 73 provides a control signal on line 61 to the X beam position counter 60 to cause counter 60 to parallel store the low-order 10 bits of data from bus 57 (which specifies a coordinate in the X axis of the beam).

After the counter 60 has received the first word, the sequencer 73 is stepped to the second stage by a NEXT signal from processor 26 and provides the control signal on line 62 to cause the Y beam position counter 60' to parallel store the low-order 10 bits from bus 57 (which specifies a coordinate in the Y axis of the beam).

After receipt of the second word, the sequencer 73 is stepped by the NEXT signal to the third stage. The sequencer 73 provides the control signal on line 63 to cause the counter 58 to parallel load the low-order 10 bits of the third word into length counter 58 and to load the two high-order bits into store 72. The two high-order bits, BIT 14 and 15, designate the direction of scan (positive or negative) and the axis of scan (X or Y), respectively.

Upon the receipt of the two high-order bits, the sequencer 73 is stepped by the NEXT signal to the operating state (state 4) removing through gate 93 the beam blanking signal on line 52 and enabling the clock signal through gate 92 to counter 58. The control unit 59 then steps the counter 58 at the clock rate (for example, 10 Hz or greater) until the length counter 58 is counted down to zero.

The control unit 59 provides the control signal on line 64. The control signal on line 64 causes the counters 60 and 60' to be set for incrementing or decrementing in accordance with the 1 or 0 of BIT 14 in store 72. At the same time BIT 15 from store 72 causes either gate 94 or gate 95 to be enabled whichever one corresponds to the scan axis. If BIT 15 is a logical 1, then gate 94 is enabled and the counter 60 is stepped by the clock signal on line 66 while counter 60' is not stepped. If BIT 15 is a logical 0, the counter 60' is stepped by the clock signal on line 66' while counter 60 is not stepped. The 10-bit outputs on lines 53 and 53' from counters 60 and 60' connect to converters 32 and 32'. One of those outputs changes during a line scan while the other is fixed.

When the length counter 58 is counted down to zero, the zero detector 50 senses a zero, resets the sequencer 73 through gate 90 to the beginning of the sequencing at state 1 and signals the processor 26 to send a sequence of three additional words.

If at any time during the scanning mode either the STOP SCAN lines 12 or 12' signals to stop the scanning, the NOR gate 91 inhibits clock outputs from gate 92 and generates the BEAM BLANK signal through gate 92 until neither STOP SCAN signal is present.

Figure 4:
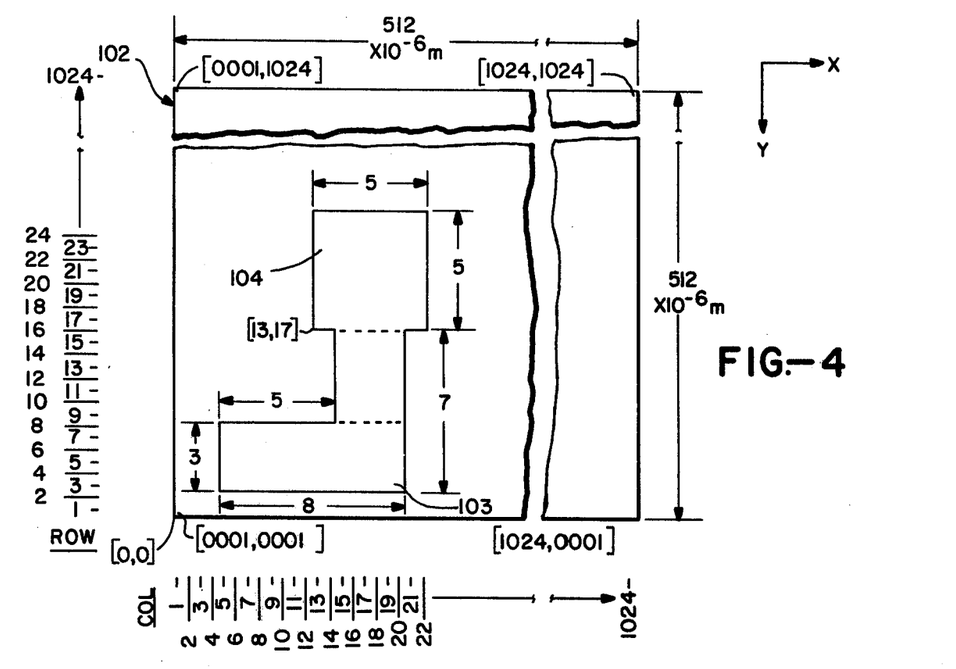
FIG. 4 depicts a representation of the electron beam scan field produced by the FIG. 1 apparatus.

Field Scan - FIG. 4

In FIG. 4, the scan field 102 produced by the electron beam column 76 of FIG. 1 is shown in greater detail. The scan field 102 covers an area 512 by 512 microns ($512 \times 10^{-6}$ meters square). That area is divided into 1,048,576 addressable locations where each location appears at the intersection of one of 1,024 rows and one of 1,024 columns. The columns are defined by the 10-bit X address and the rows are defined by the 10-bit Y address previously described in connection with the line generator of FIG. 3. The line generator of FIG. 3 causes the electron beam to be deflected so as to be incident at any one of the 1,048,576 locations specified by a row address and a column address.

In a typical embodiment, the electron beam spot size is 0.5 micron in diameter. With this spot size for the electron beam and with the 1,024 addresses per axis, the entire 512 by 512 micron scan field or any part thereof, may be exposed by the electron beam.

In connecton with FIG. 4, an example of how the apparatus of FIG. 1 operates to scan a particular part of a circuit is described. In FIG. 4, the scan field 102 includes in the lower left hand corner a printed circuit conductor 103 which terminates in a printed circuit land 104. The conductor 103 is 3 microns wide, has a right angle and terminates in a land 104 which is 5 microns square.

The pattern of FIG. 4 is comprised of three rectangular shapes, namely, a lower shape 103' measuring 3 by 8 microns, the upper land shape 104 measuring 5 by 5 microns, and the middle connecting shape 103'' measuring 3 by 4 microns. The three shapes 103', 103'' and 104 are each defined in terms of their X and Y coordinates and their XL and YL lengths in the format previously described in connection with the TABLE. Using the same format, the three shapes 103', 103'' and 104 of FIG. 4 are defined by RECORD NO. 25, RECORD NO. 26 and RECORD NO. 27, respectively, in the following CHART I.

CHART I

| RECORD NO. | X | Y | XL | YL |
|---|---|---|---|---|
| 25 | 5 | 3 | 16 | 6 |
| 26 | 15 | 9 | 6 | 8 |
| 27 | 13 | 17 | 10 | 10 |

The RECORD NO.'s 25, 26 and 27 are stored in memory 7 under command of the computer 4 after the table 24 has been positioned to expose the 512 by 512 micron scan field of FIG. 4 with the zero/zero X and Y axis coordinates [0,0] in the lower left-hand corner. With at least the first one of the three records in memory 7, the line processor 28 commences operation by accessing RECORD NO. 25. Processor 28 compares XL and YL and determines that an X axis scan is to be performed. Next, the A and B buffers are initially loaded and then the processing loop is entered until RECORD NO. 25 (shape 103') has been scanned. After RECORD NO. 25, RECORD NO.'s 26 and 27 are similarly scanned. The A and B buffer contents for all three records are shown in the following CHART II.

CHART II

| RECORD NO. | A Buffer | | | | | B Buffer | | | | |
|---|---|---|---|---|---|---|---|---|---|---|
| | LOOP | X | Y | XL | 14/15 | YL | LOOP | X | Y | XL | 15/14 | YL |
| 25 | D1 | 5 | 3 | 16 | 1/1 | 6 | D2 | 21 | 4 | 16 | 1/0 | 5 |
| 25 | D3 | 5 | 5 | 16 | 1/1 | 4 | D4 | 21 | 6 | 16 | 1/0 | 3 |
| 25 | D5 | 5 | 7 | 16 | 1/1 | 2 | D6 | 21 | 8 | 16 | 1/0 | 1 |
| 25 | D7 | 5 | 9 | 16 | 1/1 | 0 | D8 | 21 | 10 | 16 | 1/0 | −1 |
| 26 | D9 | 15 | 9 | 6 | 0/1 | 8 | D10 | 16 | 17 | 5 | 0/0 | 8 |
| 26 | D11 | 17 | 9 | 4 | 0/1 | 8 | D12 | 18 | 17 | 3 | 0/0 | 8 |
| 26 | D13 | 19 | 9 | 2 | 0/1 | 8 | D14 | 20 | 17 | 1 | 0/0 | 8 |
| 26 | D15 | 21 | 9 | 0 | 0/1 | 8 | D16 | 22 | 17 | −1 | 0/0 | 8 |
| 27 | D17 | 13 | 17 | 10 | 1/1 | 10 | D18 | 23 | 18 | 10 | 1/0 | 9 |
| 27 | D19 | 13 | 19 | 10 | 1/1 | 8 | D20 | 23 | 20 | 10 | 1/0 | 7 |
| 27 | D21 | 13 | 21 | 10 | 1/1 | 6 | D22 | 23 | 22 | 10 | 1/0 | 5 |
| 27 | D23 | 13 | 23 | 10 | 1/1 | 4 | D24 | 23 | 24 | 10 | 1/0 | 3 |
| 27 | D25 | 13 | 25 | 10 | 1/1 | 2 | D26 | 23 | 26 | 10 | 1/0 | 1 |
| 27 | D27 | 13 | 27 | 10 | 1/1 | 0 | D28 | 23 | 28 | 10 | 1/0 | −1 |

In the manner previously indicated in conjunction with FIG. 3, the X beam position counter 60 is loaded with a 10-bit binary word which is the X coordinate in buffer A, loop D1 of CHART II and which specifies column 5.

Thereafter, the Y beam position counter 60' is loaded with another 10-bit binary word which is the Y coordinate in buffer A, loop D1 of CHART II and which specifies row 3. The outputs of the counters 60 and 60' are fed to the X deflection DAC 32 and the y deflection DAC 32', to cause the electron beam to be positioned at the point of column 5 and row 3.

Meanwhile, the length counter 58 is loaded with still another 10-bit word (which is the XL count in buffer A, loop D1 of CHART II) representing the distance (16 one-half microns) to the last location of the conductor 103 in row 3, which is column 20. At the same time, the control unit 59 receives BIT 14 as a logical 1 and BIT 15 as a logical 1, which together, indicate that the scanning is to occur in the positive X direction. After the loading from buffer A has been completed, the beam blanking signal on line 52 is removed and the X axis address in the X beam position counter 60 is incremented while the length counter 58 is simultaneously decremented to a zero count. When the count in length counter 58 reaches zero, the beam blank signal is turned on and no further exposure in row 3 will occur. The zero detector 50 causes the control unit 59 to load three new 10-bit numbers for the next scanning line from the B buffer as shown in CHART II. An identical 10-bit number indicating column 21 is stored in the X beam position counter 60, and the Y beam position counter 60' is loaded with a 10-bit number which indicates row 4. Then, the X and Y DAC's 32 and 32' supply analog signals to position the beam at the column 21 and row 4 location.

An XL length count of 16 is loaded into counter 58 and the control unit 59 detects BIT 14 as a logical 0 and BIT 15 as a logical 1 all as shown in the B buffer of CHART II for loop D2.

The X beam position counter is decremented and the beam is moved in the negative X direction while scanning the row until the length counter reaches a zero count. Scanning in this manner for each X row between columns 5 through 21 continues until the entire shape 103' has been scanned (which occurs at loop D6 in CHART II). Note that D6 is the last buffer entry used for shape 103". When the processing loop gets to D7, it detects a 0 in the YL field so that the contents of both the A and B buffers in loops D7 and D8 are never dumped to the line generator. Rather, the processor 26 jumps to D9 to start a Y axis scan of shape 103". After the Y axis of shape 103" is complete (at D14), the X axis scanning for the land 104 is started at D17 and becomes complete at D26.

All of the scanning of the shapes 103', 103" and 104 in FIG. 4 occurs without any requirement that the table 24 of FIG. 1 be moved.

It should be observed that the data rate for scanning the pattern comprising the conductor 103 and the land 104 is determined by the bit rate of data from the counters 58, 60 and 60'. That bit rate is defined by the clock rate at which the counters 58, 60 and 60' are stepped. In the present invention, time is not wasted scanning areas of the scan field 102 which are not to be exposed by the electron beam. While the data bit rate of scanning is the rate of clocking counters 58 and 60, the data rate for loading three words into the line generator 28 is also important in maintaining a high data rate because three words must be accessed fo each line to be scanned by the line generator 28. On the other hand, the data rate between the line processor 26 and the computer 4 need only be at a rate great enough to exceed the line rate of scanning. For example, a data rate of $10^6$ words per second between computer 4 and processor 6 (on a non-continuous burst mode basis) normally sustains a $10^8$ bit per second data rate between line generator 28 and column 76.

Figure 5:
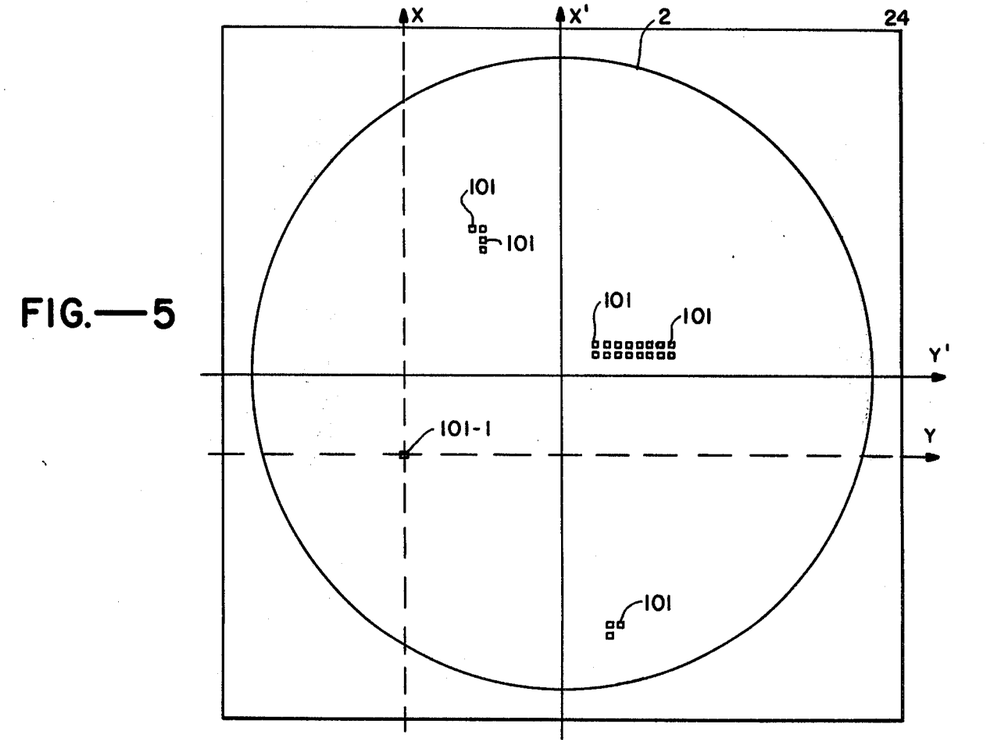
FIG. 5 depicts a top view of the table and work piece which are utilized in the FIG. 1 apparatus.

Table Position - FIG. 5

In FIG. 5, the table 24 and work piece 2 of FIG. 1 are shown in greater detail. The work piece 2 is typically a semiconductor wafer of approximately 100 millimeters in diameter. The wafer 2 has a center indicated by the intersection of the X' and Y' axes. The electron beam from electron beam column 76 of FIG. 1 is incident upon the wafer 2 at a location indicated by the intersection of the X and Y axes. The table 24 and wafer 2 are relatively movable with respect to the incident electron beam. Therefore, the X' Y' axes are relatively movable with respect to the XY axes through movment of the table 24. In FIG. 5, the point of incidence (intersection of X and Y) of the electron beam is shown in the lower left quadrant of the X' Y' axes. In FIG. 5, the area of incidence of the electron beam is at one row and one column address within a scan field of the FIG. 4 type. That scan field is in turn within one of many chip areas.

The particular chip area 101-1 over which the scan field of the electron beam is incident is determined by the position of the table 24 as defined by axes X' Y'. The chip areas 101 are areas which can be ultimately diced and then packaged to form individual integrated circuits. A chip area can be and typically is larger than the scan field of the electron beam. Therefore, each chip area is divided into partitions which can be individually exposed by the beam scan field. The table 24 and wafer 2 are moved to superimpose the beam scan field over a selected chip area and over a selected partition within a chip area.

In FIG. 5, the electron beam axes X' Y' is located to position the electron beam scan field over a chip area 101-1. The scale of FIG. 5 does not allow the partitions of the chip area 101-1 to be observed.

Figure 6:
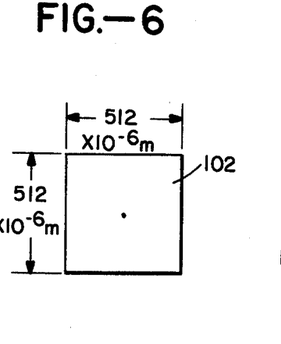
FIG. 6 depicts a representation of the FIG. 4 scan field at a reduced scale.
Figure 7:
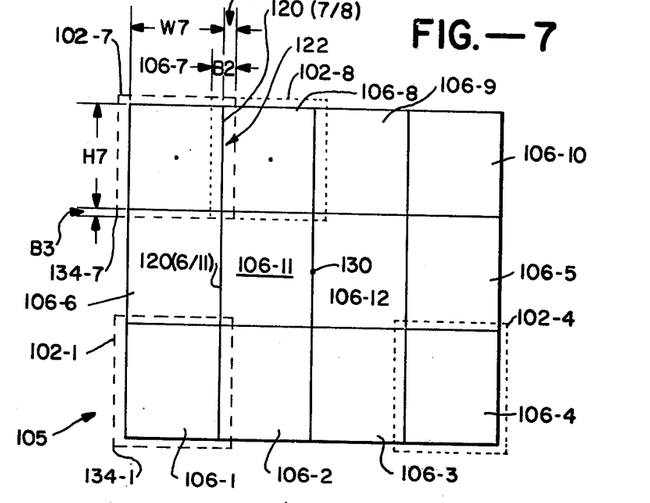
FIG. 7 depicts a chip area formed by a plurality of adjacent scan fields of the FIG. 4 type at the scale shown in FIG. 6.

In one application of the present invention, the beam scan field 102 as shown in FIGS. 4 and 6, is typically 512 by 512 microns and the chip area 105, as shown in FIG. 7, is typically 1350 by 1606 mircons. Since the scan field 102 is smaller than the chip area 105, the chip area 105 is divided into twelve partitions 106. Each partition 106 is smaller than the scan field 102. Each partition is positioned, at a different time, to be superimposed by the electron beam scan field so that twelve different positions of the table 24 and wafer 2 are needed to permit one chip area 105 to be fully scanned by the electron beam.

In FIG. 5, the electron beam scan field is positioned over the chip area 101-1. Wafer 2 will accomodate hundreds of other chip areas of the same size, some of which are represented by chip areas 101 in FIG. 5. The table 24 is positionable to locate any chip area 101 (and any partition of a chip area) beneath the electron beam scan field.

Chip Area Formation By Overlapping Scan Fields - FIGS. 6 & 7

In FIG. 6, a scale representation of the electron scan field 102 like that previously described in FIG. 4 is shown.

in FIG. 7, a chip area 105 is shown having the dimensions of 1,606 microns by 1,350 microns. The chip area 105 is further divided into the partitions 106 and specifically the twelve partitions 106-1, 106-2, ..., 106-12. The partitions are each smaller than the scan field 102 of FIG. 6. For example, the partitions are 450 microns by 401.5 microns in a typical example. Note that each of the partitions 106 of FIG. 7 can be totally enclosed within the scan field 102 shown to the same scale in FIG. 6.

In FIG. 7, the scan field 102 of FIG. 6 is shown positioned relative to the partition 106-7. When so positioned, the scan field 102 is designated as scan field 102-7. The scan field 102-7 is designated by long broken lines in FIG. 7. Also in FIG. 7, the scan field 102 is shown positioned over the partition 106-8 and the scan field is shown as short broken lines and is designated as scan field 102-8. The boundary line 120(7/8) between partitions 106-7 and 106-8 is covered both by the scan field 102-7 and the scan field 102-8. There is a region 122 having a dimension B2 which is common to both the scan field 102-7 and the scan field 102-8. In accordance with the present invention, electron beam scanning within the region 122 can be performed either in connection with the scan field 102-7 or in connection with the scan field 102-8. While only the partitions 102-7 and 102-8 have been indicated showing the overlapping scan field relationship, each of the partitions in FIG. 7 and the adjacent partitions on any side similarly have an overlapping boundary relationship relative to the electron beam scan fields.

The purpose of this overlapping boundary relationship is to permit portions of the chip pattern which lie within the overlapping boundary region, such as region 122, to be selectively processed either in one scan field (eg. 102-7) or in the other scan field (102-8). This selective scanning in one or the other of the possible scan fields avoids the necessity of scanning patterns within the boundary using two different scan fields. It has been found that when patterns having critical dimensions are scanned by two different scan fields, that is, partially in one scan field and partially in another scan field, substantial errors are frequently introduced.

In accordance with the present invention, such errors can be reduced or eliminated by wholly scanning critical dimensions in the boundary region using only one of the two possible scan fields.

In FIG. 7, if the width of the partition, W7, is 401.5 microns and the scan field 102-7 is 512 microns, the portion of the boundary B1 is 55.5 microns and the full boundary region demension B2 is 110.5 microns. In a similar manner, a portion of the boundary region having dimension B3 lies between partitions 106-7 and 106-5 and measures 31 microns. The full boundary between scan field 102-6 (not shown) and the scan field 102-7 is then 62 microns wide.

In the above two-record format of CHART III, the "0" in the first record WORD 4 coupled with some number in WORD 3 designates that a special shape is being speicfied as distinguished from a rectangular shape which never has a 0 for WORD 4.

Figure 9:
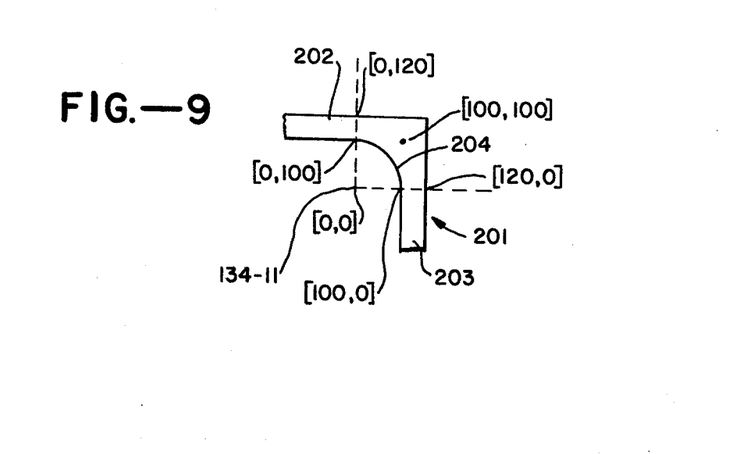
FIG. 9 depicts a portion of a circuit pattern which utilizes special shapes.
Figure 10:
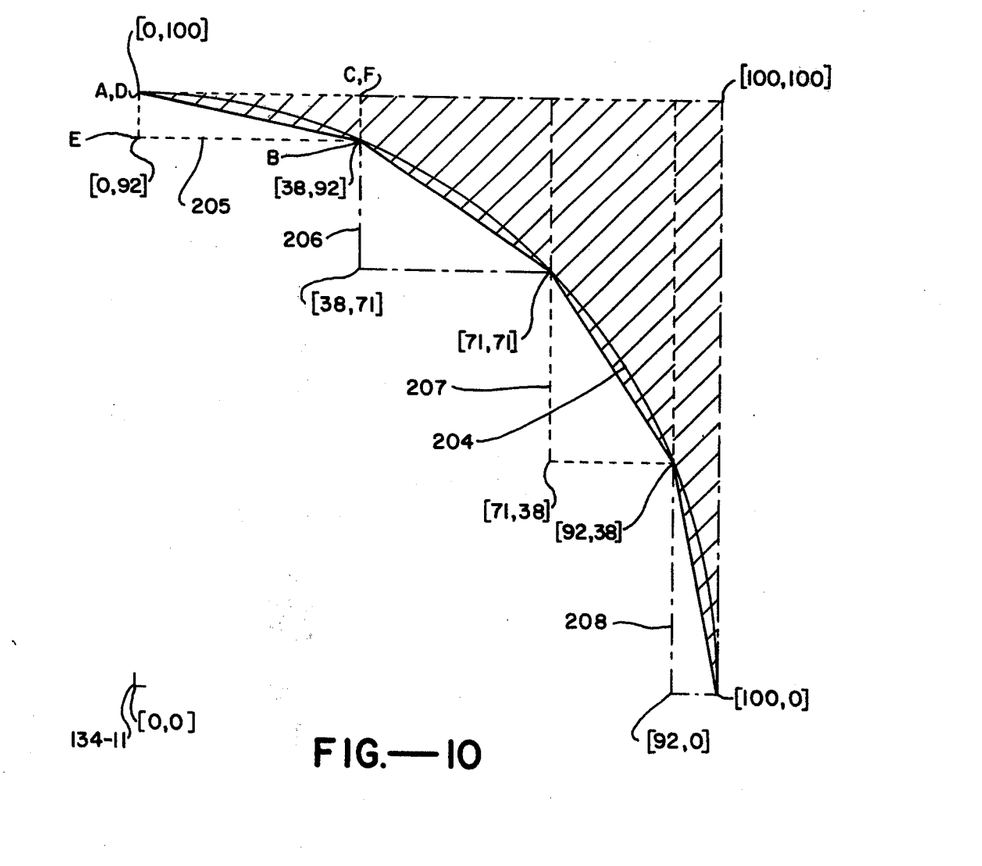
FIG. 10 depicts in enlarged detail how one curved portion of the FIG. 9 circuit pattern is traced with special shapes.

Special Shape Example - FIGS. 9 & 10

Figure 8:
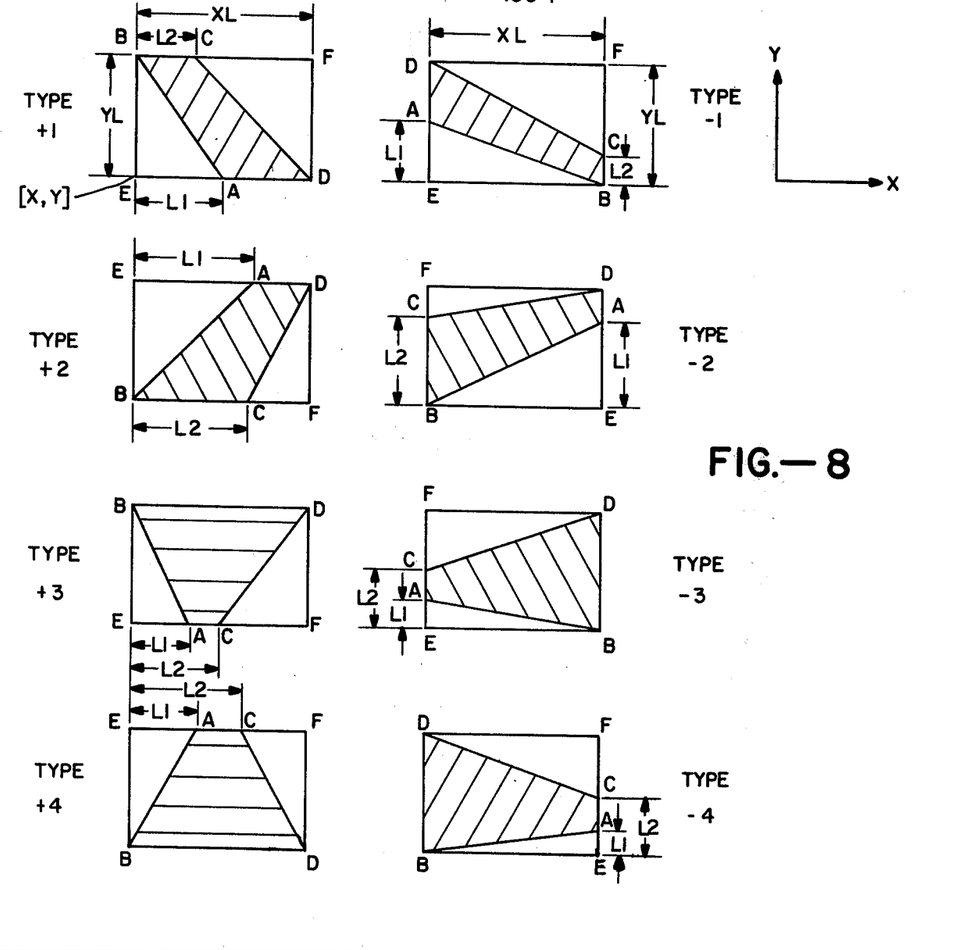
FIG. 8 depicts special shapes other than rectangles which may be scanned in accordance with the present invention.

In FIG. 9, a portion of a circuit pattern 201 is shown having a horizontal leg 202 and a vertical leg 203. The lower left-hand edges of the legs 202 and 203 connect in a generally curved arc portion 204. Such an arc portion is desirable, for example, in high voltage diodes where a rectangular corner might cause a voltage discharge. For purposes of explanation, it has been assumed that the arc portion 204 is curved about an origin 134-11 having X and Y coorindates [0,0]. This arc portion extends about [0,0] from a point [0,100] to a point [100,0]. All of the points of the pattern 201 are readily scanned using rectangular shapes except that portion within the square bounded by the coordinates [0,0], [0,100], [100,100], and [100,0]. In order to scan that portion of the pattern 201 within that square and bounded by the arc portion 204, one or more of the shapes of FIG. 8 are employed.

In FIG. 10, the arc portion 204 is scanned using a TYPE -1 shape four times. The four shpaes fit within the four rectangles 205, 206, 207 and 208. The shapes and other information for the arc portion of FIG. 10 are given by the following CHART IV in accordance with the format of CHART III.

CHART IV

| RECORD NO. | WORD 1 L1 | WORD 2 L2 | WORD 3 TYPE | WORD 4 O | RECORD NO. | WORD 1 X | WORD 2 Y | WORD 3 XL | WORD 4 YL |
|---|---|---|---|---|---|---|---|---|---|
| 28 | 8 | 8 | −1 | 0 | 29 | 0 | 92 | 38 | 8 |
| 30 | 21 | 29 | −1 | 0 | 31 | 38 | 71 | 33 | 29 |
| 32 | 33 | 62 | −1 | 0 | 33 | 71 | 38 | 21 | 62 |
| 34 | 38 | 100 | −1 | 0 | 35 | 92 | 0 | 8 | 100 |

Scanning Special Shapes - FIG. 8

In FIG. 8, eight different types of special shapes which can be scanned by the apparatus of FIG. 1 are shown. The shapes of FIG. 8 are employed for scanning other than rectangles. In FIG. 8, the eight types are designated TYPES +1, +2, +3, +4, −1, −2, −3, and −4. Each of the shapes of FIG. 8 is a quadralateral ABCD. Each of the shapes fits within a rectangle having sides XL and YL where the sides AC and BD each are colinear with a different side of the rectangle, but the sides AB and AD are not shown as and are not necessarily colinear with a rectangle side. The displacement of the point A from the side BE of the rectangle is given by the dimension L1 and the displacement of the point C from the side BE of the rectangle is given by the dimension L2.

With the above nomenclature, each of the eight shapes of FIG. 8 is uniquely defined by defining XL, YL, L1 and L2. Furthermore, the position of the quaderlateral shapes of FIG. 8 on a scan field is defined by defining the coordinates of the lower left-hand corner of the rectangle as X and Y. Using the above information, the apparatus of FIG. 1 specifies special shapes using two sequential records of four words for each record having a format of the following CHART III:

CHART III

| RECORD NO. | WORD 1 | WORD 2 | WORD 3 | WORD 4 |
|---|---|---|---|---|
| 1' | L1 | L2 | TYPE | O |
| 2' | X | L | XL | YL |

In CHART IV and FIG. 10, RECORD NO's. 28 and 29 specify rectangle 205 with XL and YL dimensions measuring 38 by 8 one-half microns with a lower left-hand origin at [0,92]. In RECORD NO. 28, a TYPE −1 shape is specified with both L1 and L2 equal to 8 one-half microns. Since L1 and L2 both equal YL, the points A and D and the points C and F are respectively coincident forming the shape 205 as a right triangle (a special case of a quadralateral).

In a similar manner, each of the rectangles 206, 207 and 208 (and the enclosed shape) are specified by the record pairs 30 and 31, 32 and 33, and 34 and 35 of CHART IV.

The records of CHART IV are transferred to memory 7 by computer 4. It remains for the line processor 26 to transform the record numbers to line scan information. The transformation is straight forward and can be performed by any programmer in a manner similar to that explained for rectangular shapes in connection with FIG. 4.

The transformation carried out by the processor 26 for the shapes of FIG. 8 is explained as follows. The positive TYPE shapes are scanned along the X axis. For each line to be scanned, the X coordinate, and the Y coordinate as well as the line length can change. Referring to TYPE +1 shape, for example, the first line is scanned from the starting coordinates at point A in a positive X direction to the end point D. The length of the line from A to D (as loaded into the length counter) is readily calculated by processor 26 as the difference between XL and L1. The next scan is in the −X direction with a new starting coordinate in the Y axis incremented by +1 over the Y coordinate for the first line. The new starting coordinate in the X axis, however, must be calculated. The X axis starting coordinate for each line scan is a function of the slope of the line DC. The slope of the line DC is known since XL, YL and L2 are known quantities. Conventional trigonometric calculations are performed to determine the X axis starting coordinate. Also to be determined is the length of the X axis scan which is the distance between the line DC and AB at a particular Y coordinate. In order to determine the length of the X axis scan, the slope of the line AB is employed to determine the X axis end coordinate on the line AB. The slope of the line AB is, of course, known, since the quantities XL, XL and L1 are known. The line processor 26 performs routine trigonometric calculations to determine these beginning and end values for each line. In this manner, the shaded area between the lines AB and CD is scanned a line at a time in the X axis. In a similar manner, the negative TYPE shapes of FIG. 8 are employed to scan the area between the lines AB and CD with scanning in the Y axis.

While the invention has been particularly shown and described with reference to the preferred embodiments thereof, it will be understood by those skilled in the art that changes in form and details may be made therein without departing from the spirit and the scope of the invention.

What is claimed is:

1. An apparatus for controlling an exposing beam to selectively scan a pattern on a work piece comprising,
    computer apparatus for supplying digital information records specifying the pattern to be scanned,
    processor apparatus, connected to receive the information records from said computer apparatus, for converting the information records to line scan information,
    line generator apparatus, connected to receive the line scan information from said processor apparatus, for providing beam position signals to scan the exposing beam on the work piece at locations determined by the scan information.

2. The apparatus of claim 1 including,
    X and Y deflection means responsive to X and Y axis analog signals, respectively, for controlling the X and Y axis deflection of the exposing beam, respectively,
    X and Y axis digital-to-analog converters connected to provide said X and Y axis analog signals, respectively, in response to X and Y axis coordinates determined by the beam position signals.

3. The apparatus of claim 1 including a movable table, carrying said work piece, for moving the work piece relative to the scan field of the exposing beam and including drive means for moving said table to a commanded position in response to commands from said computer apparatus.

4. The apparatus of claim 3 including a position measurement unit for measuring the actual position of said table and work piece, including means for providing correction signals as a function of the difference between the commanded position and the actual position of said table, and including means for summing said correction signals with said analog signals whereby the position of said exposing beam is accurately maintained relative to the actual position of said work piece.

5. The apparatus of claim 4 wherein said measurement unit is an interferometer providing digital actual position signals, wherein said computer apparatus supplies digital commanded position signals, and where said apparatus includes a digital subtractor means for forming digital error signals as the difference between said digital actual position signals and said digital commanded position signals and said apparatus includes digital-to-analog converter means for converting said digital error signals to said correction signals.

6. The apparatus of claim 5 including means for providing a stop scan signal when said error signals exceed predetermined magnitudes and including means for inhibiting further scanning during the presence of said stop scan signals.

7. The apparatus of claim 5 including means for providing drive signals to said drive means with magnitudes determined by the magnitudes of said error signals.

8. The apparatus of claim 1 wherein said line generator apparatus includes,
    X and Y beam position counters for storing X and Y axis coordinates, respectively, for controlling the X and Y axis positions of the exposing beam, respectively,
    length counter means for storing a length count representing the number of scan locations in a predetermined direction of scan,
    control means including scan axis store means for specifying said X axis or said Y axis as said predetermined direction of scan, said control means including clock means for clocking said length counter means to decrement said length counter and for clocking the one of said beam position counters corresponding to said predetermined direction of scan, said control means including direction store means for specifying a positive or negative direction of scan and responsively controlling the incrementing or decrementing, respectively of said one of said beam position counters by said clock means.

9. The apparatus of claim 8 including sequencer means for loading said position counters, said length counter, said scan axis store means and said direction store means in response to line scan information from said processor apparatus.

10. The apparatus of claim 8 including zero detection means, connected to said length counter means, for detecting when said length counter has been decremented to zero to indicate the end of a line scan and including means to reload said counters and said store means in response to said zero detection to commence a new line scan whereby said exposing beam is scanned to expose said pattern a line at a time.

11. The apparatus of claim 1 wherein said processor apparatus is controlled to provide said line scan information as equal length lines starting at the same coordinate whereby rectangular shapes are scanned.

12. The apparatus of claim 1 wherein said processor apparatus is controlled to provide said line scan information as unequal length lines starting at different coordinates whereby special non-rectangular shapes are scanned.

13. An apparatus for controlling the scanning of a pattern on a work piece comprising,
    electron beam column apparatus including an electron source providing an electron exposing beam, a deflection unit responsive to deflection signals for selectively deflecting the electron beam over a scan field on a work piece, a work chamber containing the work piece, a table movable relative to the scan field for positioning the work piece and table at a commanded position, a position measurement unit for measuring the actual position of the work piece, computer apparatus for supplying digital information records specifying the pattern to be scanned and digital command for specifying the commanded position of the work piece and table, drive means, connected to receive the digital command from said computer apparatus, forming drive signals for positioning the table and work piece at the commanded position, processor apparatus, connected to receive the information records from said computer apparatus, for converting the information records to line scan information, line generator apparatus, connected to receive the line scan information from said processor apparatus, for providing beam coordinate signals, converter means for converting the coordinate signals to deflection signals to scan the exposing beam on the work piece at locations determined by the scan information.

14. The apparatus of claim 13 including means for providing correction signals as a function of the difference between the commanded position and the actual position of said table, and including means for summing said correction signals with said deflection signals whereby the position of said exposing beam is accurately maintained relative to the actual position of said work piece.

15. The apparatus of claim 14 wherein said measurement unit is an interferometer providing digital actual position signals and where said apparatus includes a digital subtractor means for forming digital error signals as the difference between said digital actual position signals and said digital commands and said apparatus includes digital-to-analog converter means for converting said digital error signals to said correction signals.

16. The apparatus of claim 15 including means for providing a stop scan signal when said error signals exceed predetermined magnitudes and including means for inhibiting further scanning during the presence of said stop scan signals.

17. The apparatus of claim 15 wherein said drive means includes means for providing the drive signals with magnitudes determined by the magnitudes of said error signals.

18. The apparatus of claim 13 wherein said line generator apparatus includes,

X and Y beam position counters for storing X and Y axis coordinates, respectively, for providing the X and Y axis coordinate signals of the exposing beam, respectively, length counter means for storing a length count representing the number of scan locations in a predetermined direction of scan, control means including scan axis store means for specifying said X axis or said Y axis as said predetermined direction of scan, said control means including clock means for clocking said length counter means to decrement said length counter and for clocking the one of said beam position counters corresponding to said predetermined direction of scan, said control means including direction store means for specifying a positive or negative direction of scan and responsively controlling the incrementing or decrementing, respectively of said one of said beam position counters by said clock means.

19. The apparatus of claim 18 including sequencer means for loading said position counters, said length counter, said scan axis store means and said direction store means in response to line scan information from said processor apparatus.

20. The apparatus of claim 18 including zero detection means, connected to said length counter means, for detecting when said length counter has been decremented to zero to indicate the end of a line scan and including means to reload said counters and said store means in response to said zero detection to commence a new line scan whereby said exposing beam is scanned to expose said pattern a line at a time.

21. The apparatus of claim 13 wherein said processor apparatus is controlled to provide said line scan information as equal length lines starting at the same coordinate whereby rectangular shapes are scanned.

22. The apparatus of claim 13 wherein said processor apparatus is controlled to provide said line scan information as unequal length lines starting at different coordinates whereby special non-rectangular shapes are scanned.

23. A method for controlling an exposing beam to selectively scan a pattern on a work piece comprising, supplying from a computer apparatus digital information records specifying the pattern to be scanned, converting in a processor apparatus the information records to line scan information, generating, in a line generator apparatus, beam position signals to scan the exposing beam on the work piece at locations determined by the scan information.

24. The method of claim 23 wherein said converting is performed to provide said line scan information as equal length lines starting at the same coordinate whereby rectangular shapes are scanned.

* * * * *